United States Patent [19]
Herbert

[11] Patent Number: 5,138,205
[45] Date of Patent: Aug. 11, 1992

[54] SYNCHRONIZED THYRISTOR FIRING CONTROL

[76] Inventor: Paul L. Herbert, 11618 Hondo Creek Dr., Corpus Christi, Tex. 78410

[21] Appl. No.: 597,993

[22] Filed: Oct. 10, 1990

[51] Int. Cl.⁵ .................... H03K 17/72; G05F 5/02
[52] U.S. Cl. ...................... 307/643; 307/305; 323/217; 323/320; 323/349
[58] Field of Search ............ 307/305, 638, 643, 648; 323/217, 320, 326, 349, 351

[56] References Cited
U.S. PATENT DOCUMENTS

| | | | |
|---|---|---|---|
| 3,891,931 | 6/1975 | Nougaret et al. | 307/643 |
| 4,456,871 | 6/1984 | Stich | 307/643 |
| 4,703,197 | 10/1987 | Fleischer et al. | 307/643 |

*Primary Examiner*—John Zazworsky

[57] ABSTRACT

The invention pertains to electrical power control more particularly to a class of circuitry known as thyristor phase control. The novel circuit can be used to control heating devices, electrical motors and generators and many other types of equipment that require a precise control of the output of a thyristor.

14 Claims, 1 Drawing Sheet

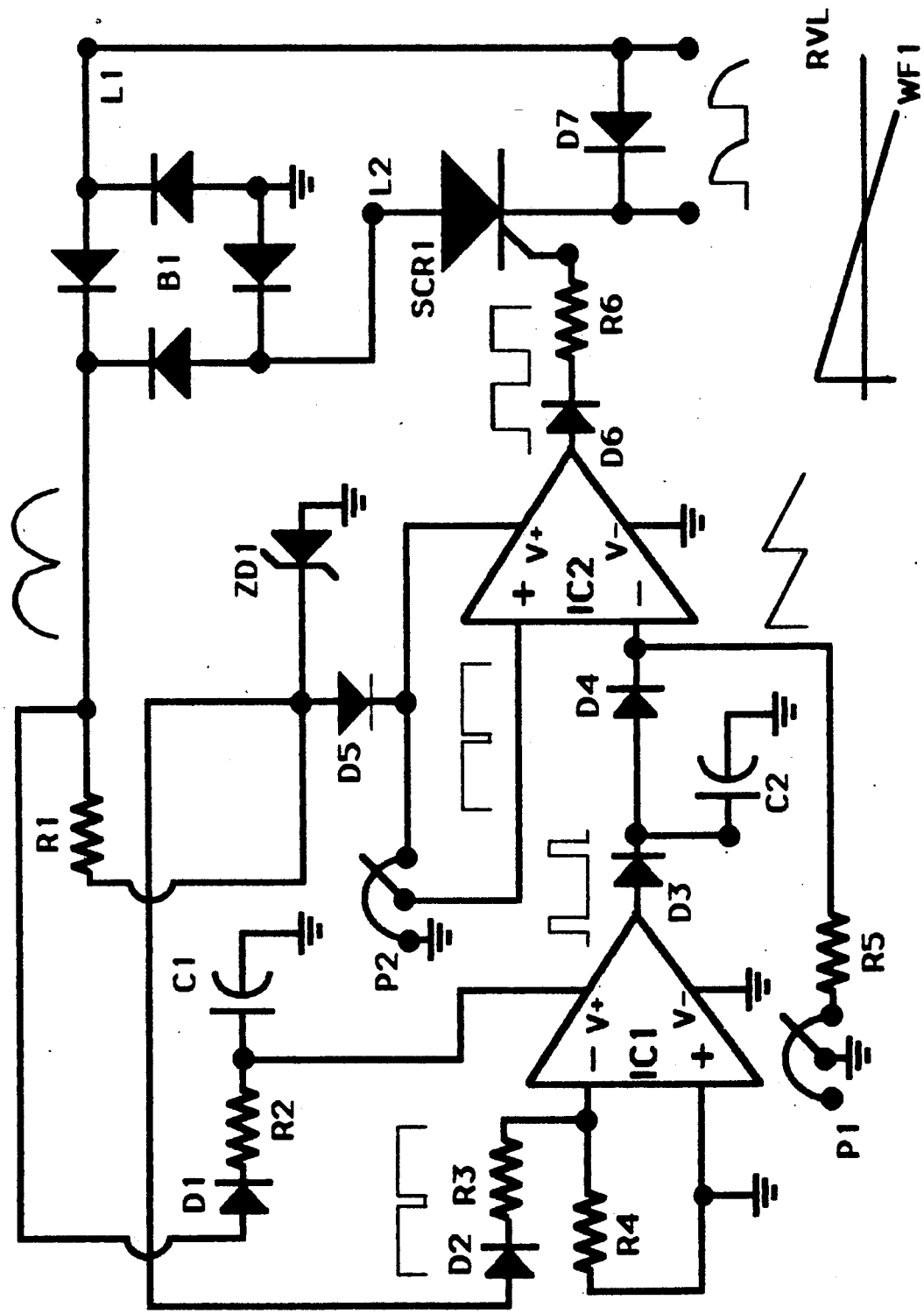

SYNCHRONIZED THYRISTOR FIRING CONTROL

FIELD OF INVENTION

This invention relates in general to electrical power control, in particular to synchronized thyristor firing control.

RELATED ART

Thyristor firing control is used in countless applications in the control of speed of electric motors, heat control of electric heating equipment, electrical generation control and many other control applications that require a control of the output of thyristors.

Most systems used to provide precise control of thyristor firing are very elaborate and require many components and a very complicated circuitry. This increases production costs and increases the probability of component failure. Because of the complexity of systems now used, most firing controls are built only for a specific use and product.

I have invented a control circuit that has very few components and will control thyristors with the same degree of accuracy as the most complicated circuit can provide. One of the best advantages of my invention is that it is very inexpensive to produce and can be used in almost any thyristor control circuit with just a very few minor changes that do not require any great change in circuitry. This results in a very low manufacturing cost and minimum reengineering time and cost. Because of the simplicity of the circuitry, component failure is at a minimum.

SUMMARY OF THE INVENTION

In fulfillment and implementation of the previously recited object, a feature of the invention resides in the fact that this circuitry provides a simple, inexpensive and very reliable means of synchronizing, regulating and controlling thyristors for uses such as heating, motor and generator control.

The primary feature of the invention is the use of only two operational amplifiers to provide synchronization, voltage detection and phase angle control. These results are achieved by using one of the op amps for synchronizing and voltage detection and the other for phase angle control, resulting in a very reliable and inexpensive circuit that can be used in a universal role in equipment that requires a circuit for thyristor phase control.

BRIEF DESCRIPTION OF THE DRAWING

The figure is the most preferred embodiment of the synchronized thyristor firing control.

DESCRIPTION OF PREFERRED EMBODIMENTS

Referring now specifically to the figure, there is illustrated the most preferred embodiment of the circuit inasmuch as it balances input voltage with output current.

An ac voltage input power source is connected to L1 and L2 of fullwave diode bridge B1 in which the −is connected to ground.

The full wave rectified +dc voltage from B1 is sent to a voltage regulating network comprising of a 5 Kilo-ohm resistor R1, and a 18 volt zener diode ZD1, producing a regulated unfiltered dc power supply. +Voltage from B1 is also supplied to an unregulated dc power supply consisting of a diode D1, 100 Kilo-ohm resistor R2, and 10 uf capacitor C1. This unregulated dc power supply is used as the power supply for v+ of op amp IC1. Diode D1 is used as a blocking device to keep capacitance from C1 from filtering back into the regulated unfiltered dc power supply.

A synchronizing circuit is formed by using IC1 as a 0 voltage detector. This is accomplished by supplying the inverted input of IC1 with regulated unfiltered +dc voltage that is passed thru a diode D2, to a voltage bridge consisting of 10 Kilo-ohm resistors R3 and R4, which is used to make sure that the voltage at the inverted input of IC1 is kept below the supply voltage of IC1. The v− and non inverted input of IC1 are connected to ground. A 0 voltage detector is formed because as long as the inverted input at IC1 is higher than its non inverted input, there is very little output current at the output of IC1. When the voltage at the inverted input of IC1 is at or near 0 volts, which occurs each time the ac voltage input power source alternates polarities, there will be a full on condition at the output of IC1 which is sent thru a blocking diode D3 to a 0.22 uf capacitor C2. IC1 is able to fire during the near 0 voltage condition because of stored voltage within its unregulated dc power supply.

This full on condition of IC1 results in a very quick pulse of current into C2 thru D3 resulting in C2 being instantly charged to a value of near the voltage level of the unregulated dc power supply. As soon as the pulse of current from IC1 has stopped, C2 will be charged to its highest value, and instantly starts to discharge. This creates a sloping waveform WF1 which slopes toward 0 volts as C2 discharges. This waveform is passed thru a diode D4 to a 22 Kilo-ohm resistor R5, which is connected to a 1 megohm potentiometer P1 to ground. P1 is used to control the discharge time of C2 to create a more or less slope toward 0 volts. The waveform is also supplied to the inverted input of an op amp IC2. IC2 is used as the firing output control to gates of thyristors. This is accomplished by supplying the inverted input of IC2 with our waveform WF1, that is not flat, and the non inverted input of IC2 with a flat voltage RVL, supplied by the output of a voltage bridge consisting of a 20 Kilo-ohm potentiometer, P2.

P2 acts as a voltage bridge with one side connected to ground and the other supplied with unfiltered regulated dc voltage thru diode D5. The output of P2 is used to adjust the output of IC2.

The output from IC2 is passed thru a diode D6 thru a 10 Kilo-ohm resistor R6, to the gate of a sensitive gate SCR SCR1, which is used to convert the ac voltage at L2 into a controllable dc voltage.

A diode D7 is placed accross the output of SCR1 and L1 to act as a freewheeling circuit in case an inductive load is placed upon the output of SCR1.

OPERATION

In describing the circuit operation, reference may be made to in describing the circuit operation, reference can be made to the drawing which illustrates, in general form, the Synchronized Thyristor Firing Control.

The currents, voltages, components and waveforms in the circuit are specified in accordance with the following:

IV    ac voltage input power at L1 and L2
RVL    voltage on the non inverted input of IC2

WF1 waveform on the inverted input of IC2
for purposes of demonstrating this device, we will assume that the IV will be 120 volts ac at 60 hertz and that the output of SCR1 is connected thru a resistive heater to L1. It must be understood that the following sequences happen within ½ cycle segments.

The sequence of operation is as follows:

An ac voltage is applied to the terminals L1 and L2 of B1. This dc voltage is then supplied to two power supplies, one unfiltered and regulated consisting of R1 and ZD1, and the other heavily filtered and unregulated consisting of D1,R2 and C1. The regulated voltage of about 18 volts dc is fed to thru blocking diode D2 to a resistor bridge consisting of R3 and R4 which act to make sure that the top of the input voltage to the inverted input of IC1 is kept at about 9 volts dc which should be lower than its v+ supply voltage.

The non inverted input and the v− of IC1 are grounded which results in the inverted input of IC1 being of a higher voltage than of the non inverted input resulting in little or no output of IC1. As the polarity of IV nears its change, the voltage at the inverted input of IC1 nears 0 volts because the voltage supplied is not filtered and contains a notch or near 0 voltage at the beginning and ending of each ½ cycle. This results in a full on condition of IC1 because at this point the inverted input and the non inverted input are the same. Because there is voltage stored in C1, a supply voltage is present for current to flow thru the output of IC1 during this 0 voltage condition.

Because the time that this no volt condition occurs is so quick, only a pulse of current is emmited from IC1 at the beginning of each ½ cycle. The current in the pulse is in direct proportion to the voltage stored at C2.

This pulse from IC1 is passed thru D3 to C2 which is instantly charged to a value near the value of C1. Since this pulse occurs only during the beginning of a ½ cycle, C2 instantly begins to discharge thru D4, R5 and P1. This network controls how fast C2 will discharge resulting in a means of controlling the waveform of C2. The more resistance to C2, the less of a discharge slope, the less resistance, more of a discharge slope. We will call this waveform WF1.

This waveform is then supplied to the inverted input of IC2 and unfiltered regulated voltage is fed thru D5 to V+ at IC2 and to a voltage bridge consisting of P2 which has one side connected to ground. P2 supplies an adjustable voltage to the non inverted input of IC2. The waveform of this voltage is flat because of the clipping effect of ZD1. V− of IC2 is grounded.

P2 is set to provide a voltage at the non inverted input of IC2 which is at a voltage that is lower than the lowest voltage that is in WF1 that is supplied to the inverted input of IC2. This results in little or no output of IC2. If the voltage at the non inverted input of IC2 is raised above any portion of the voltage in WF1, the result is that the output of IC2 will go into a full on condition at the instant that any part of WF1 is equal to or below RVL. Because WF1 is not flat and is higher at the beginning of each ½ cycle and lower at the end of each ½ cycle, the intersection of RVL and WF1 will result in some portion of WF1 being above RVL and some of it below. This results in being able to control the timing of the full on condition of the output of IC2 to change the firing delay angles of SCR1. If RVL is raised, the full on condition of IC2 will happen sooner during the ½ cycle and if RVL is lowered, the full on condition of IC2 happens later during the ½ cycle. We are able to control the firing angles of SCR1 thus regulating the current to our resistive heater by raising and lowering RVL thru P2.

If WF1 has too flat of a discharge slope, a small adjustment of RVL will have a great effect on the amount of WF1 that will be intersected during each ½ cycle. To lessen the effect P1 can be adjusted so that less resistance is connected to C2 resulting in more of a discharge slope. When there is more discharge slope, then less of WF1 will be intersected with small changes of RVL. This allows us to adjust P1 so that the response at the output of IC2 to changes in P2 are very sensitive or not so sensitive.

One aspect of this invention is that once the desired output of SCR1 has been selected, this device will regulate its own output automatically to maintain a constant wattage at the load which is the resistive heater. If the IV is raised, the output of SCR1 will lower. If IV is lowered, the output of SCR1 will raise. The reason for this is that the unregulated power supply at C1 will increase or decrease voltage in relationship with changes at IV. Because of the voltage changes at C1, the pulse current will increase or decrease to C2 which will result in the overall voltage in WF1 raising or lowering. Since the voltage at the input of P2 is regulated, the voltage level at the non inverted input of IC2 will not change once it has been adjusted, if WF1 were to raise or lower, it would have the same effect as changing RVL. This self regulating aspect means that this device could be used not only to control heating devices but other equipment such as electrical generators and motors.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A synchronized thyristor firing circuit that has the ability to synchronize and regulate conduction angles of a gated device as in a process known as AC phase control, said regulation of said conduction angles can be selectively invariant or changeable to differences in the frequency and voltage of an alternating current input power source, said circuit comprising:

said alternating current input power source;

means for converting said power source into a direct current power supply having a positive output and a negative output, said positive output connected to a means for providing a regulated and unfiltered power supply and an unregulated and filtered power supply, said negative output connected to a common circuit ground;

means, connected to the providing means, for generating a pulse of current at or near the zero voltage magnitude of said alternating power source as said alternating current source changes in polarity, said pulse of current being proportional to the average voltage of the alternating current source;

means for converting said pulse of current into a first waveform, said first waveform having its greatest value during said pulse current and decreasing linearly to a lower value before the next change of polarity of said alternating current source, the rate of decrease being adjustable;

means responsive to the regulated and unfiltered power supply to provide a second waveform that maintains a selected value, said selected value being adjustable;

means for determining when the value of said first waveform is at or less than the value of said second waveform and triggering said gated device into conduction during the time that said first waveform value is at less than the value of said second waveform;

said gated device permitting current from said alternating current power source to be applied to an electrical load.

2. The synchronized thyristor firing circuit of claim 1, wherein said alternating current input power source comprises alternating current being characterized as having a voltage waveform with zero crossings at half cycles.

3. The synchronized thyristor firing circuit of claim 1, wherein said means for converting said alternating current input power source into direct current comprises a rectifier.

4. The synchronized thyristor firing circuit of claim 3, wherein said rectifier comprises a full wave diode bridge.

5. The synchronized thyristor firing circuit of claim 1, wherein said means of generating a pulse of current at or near the 0 voltage condition of said alternating current input power source comprises a voltage comparator.

6. The synchronized thyristor firing circuit of claim 4, wherein said voltage comparator comprises a first op amp with a first op amp positive supply terminal supplied from said unregulated and filtered power supply, said first op amp negative supply terminal and non inverting input connected to said common circuit ground, said op amp's inverting input connected to a tap on a resistance bridge, said resistance bridge connected between an output of said regulated and unfiltered power supply and said common circuit ground.

7. The synchronized thyristor firing circuit of claim 1, wherein said unregulated and filtered power supply comprises a capacitor supplied serially thru a diode and resistor from the positive output of said direct current power supply.

8. The synchronized thyristor firing circuit of claim 1, wherein said means for converting said pulse of current into a first waveform comprises a capacitor supplied serially thru a diode from said pulse of current, and said capacitor provided with a discharge resistance, said discharge resistance being adjustable in value.

9. The synchronized thyristor firing circuit of claim 8, wherein said regulated and unfiltered power supply comprises a zener diode connected serially thru a resistor to the positive output of said direct current power supply which maintains a regulated voltage at said zener diode.

10. The synchronized thyristor firing circuit of claim 1, wherein said responsive means comprises an adjustable voltage bridge connected to an output of said regulated and unfiltered power supply so as to be able to adjust the selected value.

11. The synchronized thyristor firing circuit of claim 1, wherein said means for determining comprises a voltage comparator.

12. The synchronized thyristor firing circuit of claim 11, wherein said voltage comparator comprises an op amp having a positive supply terminal supplied by said regulated and unfiltered power supply and a negative supply terminal connected to said common circuit ground with said op amp's inverting input supplied with said first waveform, said op amp's non-inverting input supplied with said second waveform and an output of said op amp supplied to a control terminal of said gated device.

13. The synchronized thyristor firing circuit of claim 1, wherein said gated device comprises a device that can be converted from an electrically non-conductive state into an electrically conductive state by supplying a small electrical current to a control terminal of said device.

14. The synchronized thyristor firing circuit of claim 12, wherein said device comprises a thyristor or an SCR.

* * * * *